United States Patent [19]

Piguet

[11] 4,199,751

[45] Apr. 22, 1980

[54] DEVICE FOR THE INPUT OF ALPHANUMERICAL DATA FOR APPARATUS OF SMALL SIZE

[75] Inventor: Christian Piguet, Neuchatel, Switzerland

[73] Assignee: Centre Electronique Horloger SA, Neuchatel, Switzerland

[21] Appl. No.: 910,759

[22] Filed: May 30, 1978

[30] Foreign Application Priority Data

Jun. 8, 1977 [CH] Switzerland ............ 7033/77

[51] Int. Cl.² ............................................. G06F 3/02
[52] U.S. Cl. ......................... 340/365 S; 340/365 R; 400/83; 400/125; 178/30; 340/146.2 SY
[58] Field of Search ............... 340/365.5 R, 146.3 SY; 178/30, 18; 400/83, 84, 121, 125

[56] References Cited

U.S. PATENT DOCUMENTS

| 39,296 | 7/1863 | Livermore | |
|---|---|---|---|
| 2,922,993 | 1/1960 | Sack | 340/366 R |
| 3,142,039 | 7/1964 | Irland | 178/18 |
| 3,495,232 | 2/1970 | Wagner | 178/18 |
| 3,704,343 | 11/1972 | Howard | 178/30 |
| 3,803,834 | 4/1974 | Reese | 58/152 R |
| 3,823,545 | 7/1974 | Vittoz et al. | 58/23 R |
| 3,909,785 | 9/1975 | Howells | 340/146.3 SY |
| 3,980,823 | 9/1976 | Howard | 178/30 |
| 4,005,400 | 1/1977 | Engdahl | 340/365 R |
| 4,047,010 | 9/1977 | Perotto et al. | 340/146.3 SY X |

OTHER PUBLICATIONS

*IBM Technical Disclosure Bulletin*, vol. 14, No. 3, Aug., 1971, Wolfe, R. N., "Keyboard for Electronic Tablet or Digitizer".

*Primary Examiner*—Gareth D. Shaw
*Assistant Examiner*—Joel Miller
*Attorney, Agent, or Firm*—Wender, Murase & White

[57] ABSTRACT

A device for the input of alphanumerical data for apparatus of small size. The device comprises a keyboard formed of zones and members for the introduction of data, a monitoring display having luminous segments and electronic memorizing and decoding means, with the introduction zones enabling composition of the data, segment-by-segment, actuation of a zone making it possible to activate the segment of the display corresponding to this zone, the geometrical arrangement on the keyboard of the said zones being directly related to the arrangement of the segments of the display.

16 Claims, 11 Drawing Figures

DEVICE FOR THE INPUT OF ALPHANUMERICAL DATA FOR APPARATUS OF SMALL SIZE

BACKGROUND OF THE INVENTION

The present invention relates to a device for the input of alphanumerical data for apparatus of small size, comprising a keyboard formed of zones and data introduction elements, a monitoring display having luminous segments and electronic means of memorising and decoding.

Means for the input of alphanumerical data for apparatus of small volume are already known, in particular micro-keyboards for calculating watches, such as that forming the subject of U.S. Pat. No. 3,803,834.

In these micro-keyboards, the number of keys is equal to that of the symbols and, in the case of alphanumerical symbols, the number thereof is rather high, whilst the space available for the keys is rather restricted. The result is that the keys have to be severely miniaturised and can no longer be easily manually actuated. Therefore a ball-point pen for example, was tried having a fine point to exert the pressure necessary for actuating the key.

There are also keyboards comprising multi-function keys, in particular, on pocket scientific calculators. The two or three functions which are accomplished by one specific key are indicated, if desired, by different colours thereon. These marks take up a good deal of space and these keyboards cannot be validly employed for micro-keys.

A system for the introduction of data operating sequentially such as that described in U.S. Pat. No. 3,823,545, requires only a small number of keys, but it is very slow and laborious.

Writing systems with sequential decoding are already known, such as that forming the object of U.S. Pat. No. 3,909,785. Such a system requires only few keys but it requires a period of learning on the part of the user who must learn to form the symbols. Such an apprenticeship, even if it seems elementary, represents a limitation of the system which some people will refuse to accept.

Finally, U.S. Pat. Nos. 3,980,823 and 3,704,343 propose a display and a keyboard comprising, respectively, eight segments and eight keys or contacts. The proposed arrangement of the display segments is such that it requires a period of learning on the part of the user. The letters A, B, D, E and F, for example may be displayed in various ways, none of which is obvious to the user.

The object of the present invention is to provide a device for the input of alphanumerical data for apparatus of small size not having the above disadvantages.

According to the present invention there is provided a device for the input of alphanumerical data for apparatus of small volume with a keyboard comprising zones and members for the introduction of data, a monitoring display with luminous segments and electronic means for memorising and decoding, the said introduction zones enabling composition of the said data, segment-by-segment, the actuation of a zone making it possible to activate the display segment corresponding to the said zone, the geometrical arrangement on the keyboard of the said zones being directly related to the arrangement of the segments of the display.

The characteristics of the device are as follows:

small number of introduction zones, less than that of the symbols;
manual actuation of the zones;
the zones can be actuated in any order;
display of data entered by means of universally known symbols, making the device attractive and pleasant to use;
rapid input of the symbols, each recognising very rapidly the graphic form of the symbol that he wishes to introduce;
no period of learning necessary on the part of the user; and
simple associated electronic circuits.

DESCRIPTION OF THE PREFERRED EMBODIMENTS

Figure 1:
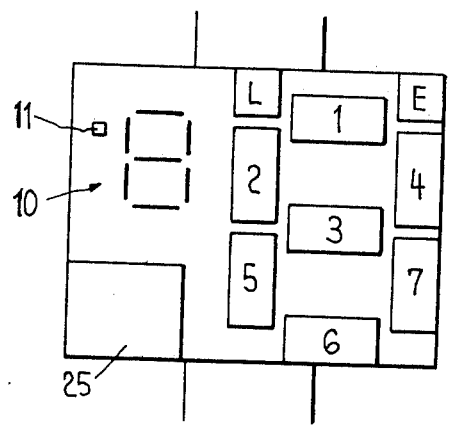
FIG. 1 is a diagrammatic plan view of one embodiment of a device for the input of alphanumeric characters according to the present invention.

FIG. 1 shows a device according to the invention, the keyboard of which is formed by seven sensitive elements having the references 1 to 7 and by three members for introducing data, which are also sensitive elements, 25, E and L. The device also has a display 10 having seven segments, on the left of which there is a reference point 11, which is capable of being activated. The geometrical arrangement of the elements 1 to 7 is the same as that of the seven segments of the display, and each element activates the segment which corresponds to it in the display when it is actuated. Each element may therefore be considered as a zone for the introduction of data. The seven elements in question make it possible to compose segment-by-segment, each of the 30 symbols of the following alphabet:

| (1) | I | 1, I | (11) | R | A | (21) | k | |
|---|---|---|---|---|---|---|---|---|
| (2) | ₴ | 2, Z | (12) | C | C | (22) | U | U |
| (3) | ∃ | 3 | (13) | E | E | (23) | Y | Y |
| (4) | ᓂ | 4 | (14) | F | F | (24) | - | − (minus) |
| (5) | S | 5, S | (15) | G | G | (25) | = | = (equal) |
| (6) | ᑲ | 6 | (16) | H | H | (26) | b | b |
| (7) | 7 | 7 | (17) | J | J | (27) | d | d |

-continued

| | | | | | | | | |
|---|---|---|---|---|---|---|---|---|
| (8) | 8 | 8, B | (18) | L | L | (28) | ꞯ | q |
| (9) | 9 | 9 | (19) | ñ | M | (29) | n | n |
| (10) | 0 | 0, D, 0 | (20) | P | P | (30) | r | r |

Some letters such as K, N, Q, R, V, W and X are impossible to trace on such a display.

The auxiliary member 25 makes it possible to enter data into the apparatus when the composition of the symbol representing it is completed.

The auxiliary member E makes it possible to erase the display in the case of an error, thus giving the possibility of composing a new symbol.

The auxiliary member L makes it possible to distinguish data which are instructions intended to control functions in the apparatus, from data which is information which is only intended to be memorised in the apparatus. This latter information can be recognised by the feature that the reference point 11, which is on the left of the display 10, is activated by an action on the member L. It is evident that in this latter group, any graphic form may be memorised, so long as it satisfies the seven segment display.

The introduction zones and the auxiliary members are both formed of sensitive elements; the introduction zones make it possible to compose the symbols to enter in the apparatus segment-by-segment, whilst the auxiliary members have functions of introduction, selection and correction of the composed symbols.

Figure 2:
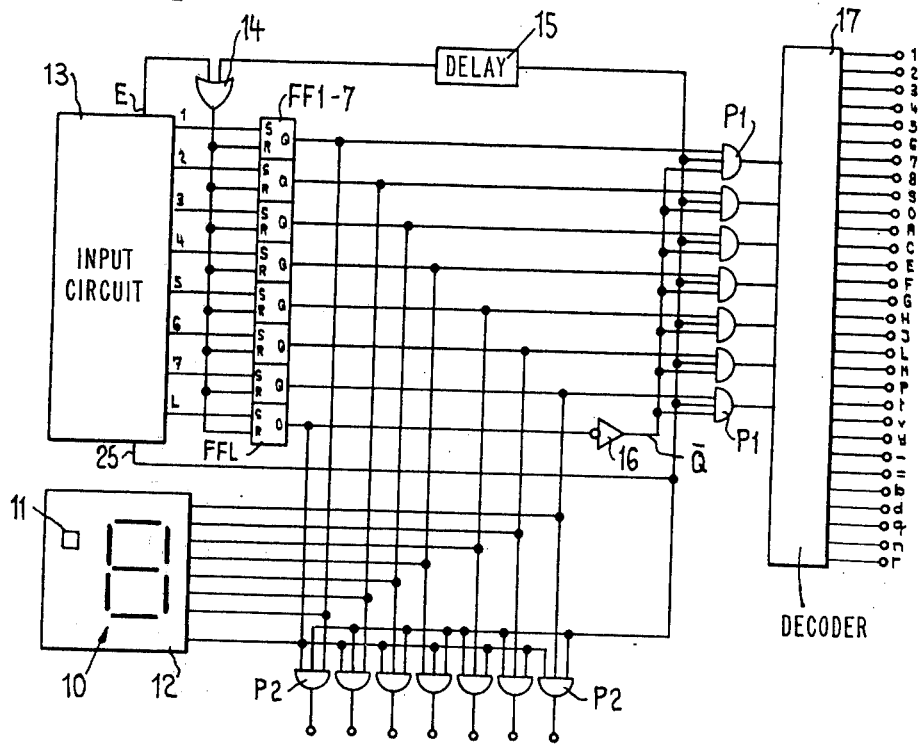
FIG. 2 is a block diagram of an electronic circuit associated with the device shown in FIG. 1 in accordance with the present invention.

FIG. 2 shows the block diagram of an electronic circuit associated with the device in FIG. 1.

The outputs 1 to 7, 25, E and L of the output circuit 13 are those which correspond to the elements and members shown in FIG. 1. They are connected to the S inputs of seven RS flip-flops FF1 to FF7 used as memories. The output L is connected to the S input of the RS flip-flop FFL also used as a memory. The R inputs of the flip-flops FF1 to FF7 and FFL are connected to the output of an OR gate 14, the inputs of which are connected, respectively, to the output E of the input circuit 13 and to the output of a delay circuit 15. The Q outputs of the flip-flops FF1 to FF7 are each connected to one of the inputs of AND gates P1 and P2, each having three inputs, and also to the inputs of a display device 12. The Q output of the flip-flop FFL is connected, on the one hand, to one of the inputs of each of the gates P1 via an inverter 16 and, on the other hand, to one of the inputs of each of the gates P2, and also to an input of the display device 12. The output 25 of the input circuit 13 is connected to one of the inputs of each of the gates P1 and P2 and to the input of the delay circuit 15. The outputs of the gates P1 are connected to a decoder 17, the 30 outputs of which deliver instructions to control the device. The seven outputs of the gates P2 represent the information to be memorised.

When an element has been actuated, it causes the Q output of the respective one of the flip-flops FF1 to FF7 to pass to the state "one", the effect of which is to activate the corresponding segment of the display 10. The member E, and also the member 25, after a period produced by the delay circuit 15, release all the flip-flops FF1 to FF7 used as memories, so that the display 10 is then erased. If the member L has been actuated, the reference point 11 is activated and the content of the memory elements is directed, when the member 25 is actuated, to the information to be memorised via the gates P2. If the member L has not been actuated, this content is directed to the instruction decoder 17 via the gates P1.

It is obvious that the elements or introduction zones, actuated manually may be of the mechanical type (keys), or capacitive or resistive. The input circuit 13 will then have to be adapted, if necessary, to the kind of element used.

Numerous variants of such a data input device already exist. For example, the member 25 may be omitted and replaced by a circuit delivering an end of symbol signal after a delay measured from the last action of the user. The member L may be omitted if the device is sufficient with 30 symbols at its disposal. The manner of erasing may vary. In particular, the member E could cancel only the last element which has just been activated, or the last elements in the reverse order of that in which they have been activated, the circuit then having a circuit memorising the input sequence. It is also possible to imagine that the member E indicates that it is desired to erase the segments of which the corresponding element is actuated. Finally, it is possible to omit the member E by providing that if one activates for a second time the element corresponding to a segment, the segment is then cancelled.

Figure 3:
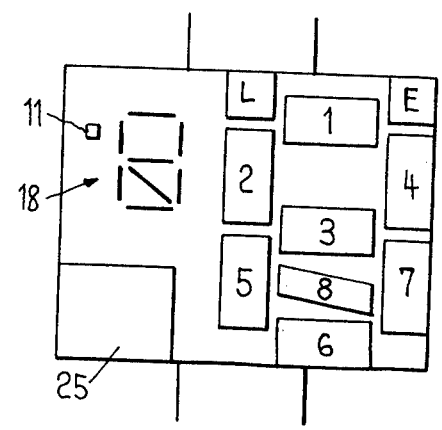
FIG. 3 is a diagrammatic plan view of an alternative embodiment of the device of FIG. 1.

Devices having another alphabet of symbols are also alternative embodiments of the invention. A first alternative comprises a display having eight segments, making it possible to obtain an alphabet of 30 symbols. This device is shown in FIG. 3 giving a display 18 with eight segments and the eight elements or zones 1 to 8 correspond thereto.

The alphabet is composed of the following symbols:

| | | | | | |
|---|---|---|---|---|---|
| 1 | 1, I | A | A | N | N |
| 2 | 2, Z | C | C | P | P |
| 3 | 3 | E | E | Q | Q |
| 4 | 4 | F | F | R | R |
| 5 | 5, S | G | G | T | T |
| 6 | 6 | H | H | U | U |
| 7 | 7 | J | J | V | V |
| 8 | 8, B | k | K | Y | Y |
| 9 | 9 | L | L | - | - (minus) |
| 0 | 0, D, 0 | M | M | = | = (equals) |

The only letters impossible to form are W and X.

A supplementary element and segment make it possible to trace these last letters and the symbol "divide":

| | | |
|---|---|---|
| ڱ | W | W |
| | , | (divide) |
| | x | X, (multiply) |

One alternative consists in using a number of introduction elements less than the number of display segments. It is then necessary to actuate two elements, simultaneously or sequentially to activate the display segments which, by correspondence with the arrangement of the elements, seems to be comprised of these two elements. Such a device requires six elements to activate the segments with the already described displays having 7, 8 or 9 segments. It may be considered that the combination of two elements necessary to be actuated in order to activate the corresponding segments of the display is a zone for the introduction of data. It is clear that any given element may belong to more than one introduction zone.

Figure 4:
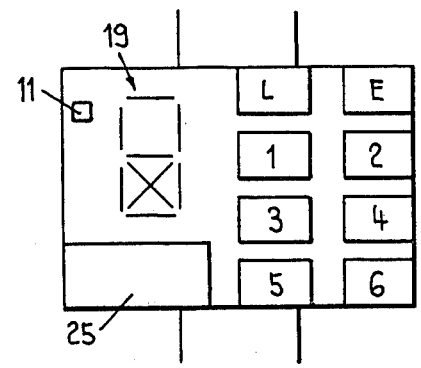
FIG. 4 is a diagrammatic plan view of an embodiment of a device in which two elements have to be actuated in order to activate a display segment.

Such a device is shown in FIG. 4 which indicates a display 19 having 9 segments and six elements 1 to 6 for activation of the display segments. Employing the above principle, it is also possible to obtain very complete displays with nine elements only.

Figure 5:
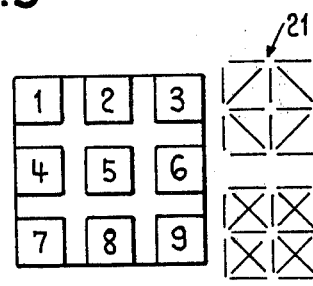
FIG. 5 is a diagrammatic plan view of another embodiment of a device illustrating the arrangement of the nine elements and two possible displays of one embodiment of the device.

FIG. 5 shows the arrangement of the nine keys and two possible display arrangements.

Figure 6:
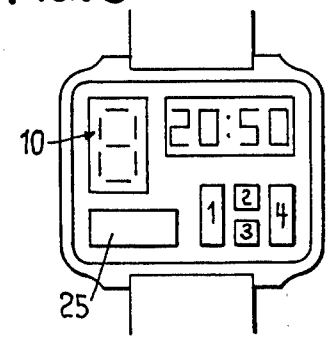
FIG. 6 is a diagrammatic plan view of an embodiment of a device using a code and in which one or two elements are actuated simultaneously.

Another alternative comprises four elements 1 to 4 for activating the segments of the display 10 as shown in FIG. 6. A code is used, shown in FIG. 7, in which one or two elements are pressed simultaneously, according to the segment it is desired to activate.

Figure 8:
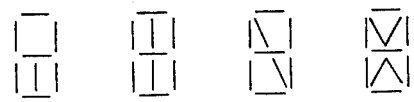
FIG. 8 is an illustration of other embodiments incorporating displays having eight and nine segments.

Finally, FIG. 8 shows some examples of the arrangement of segments for a display having 8 and 9 segments which may be used in the device according to the invention.

In all the embodiments of the device described above, the order of actuating the elements may be as desired, for each element taken individually, or each pair of elements corresponds to a particular segment of the display.

Other interesting variants do not consist in activating display segments for forming symbols, but in deactivating segments for making the desired symbol appear, the display being presented fully illuminated at the beginning of each symbol. As most of the symbols have more activated segments than extinguished, the gain in time for composing the symbols is of the order of twice.

Figure 9:
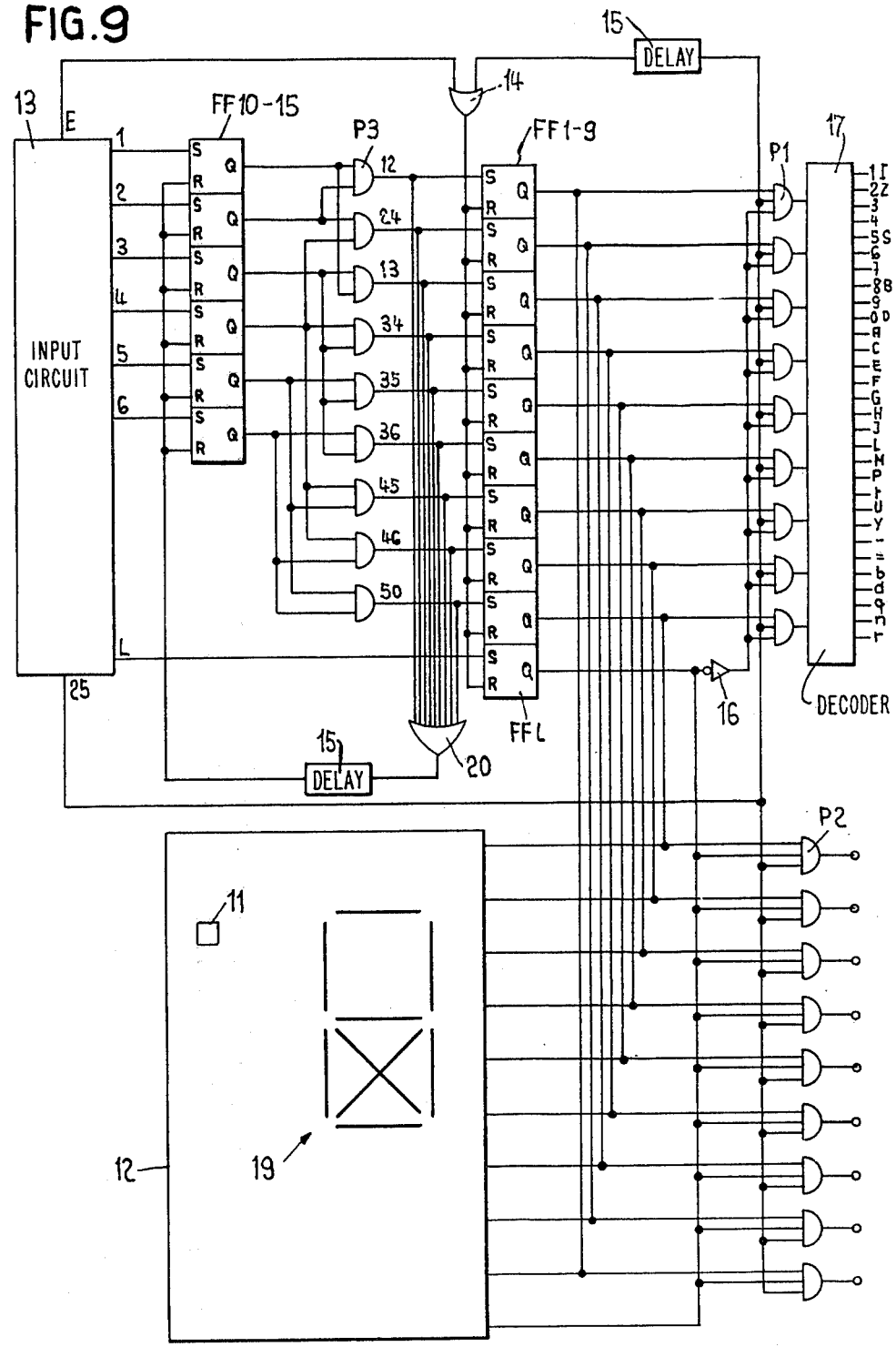
FIGS. 9, 10, and 11 are block diagrams of electronic circuits associated with the embodiments of the device shown in FIG. 4, FIG. 5, and FIGS. 6 and 7 respectively in accordance with the present invention.

FIG. 9 shows the block diagram of the electronic circuit associated with FIG. 4. The input circuit 13 makes it possible to set at "one", two of the flip-flops FF10 to FF15 in a sequential or simultaneous manner. As soon as two of these flip-flops are at "one", the AND gates P3 decode the state memorised in the flip-flops FF10 to FF15 and put at "one" one of the flip-flops FF1 to FF9. An OR gate 20, via a delay circuit 15 then resets the flip-flops FF10 to FF15. Once the symbol is completely memorised in the flip-flops FF1 to FF9, which is taken into account in the display 19, and according to whether the flip-flop FF1 is at "one" or at "zero", the symbol is sent to the gates P2, or, when the line 25 is activated, to the decoder 17 via the gates P1. The line E, as well as the line 25, but via a delay circuit 15, resets the flip-flops FF1 to FF9 through the OR gate 14.

Figure 10:
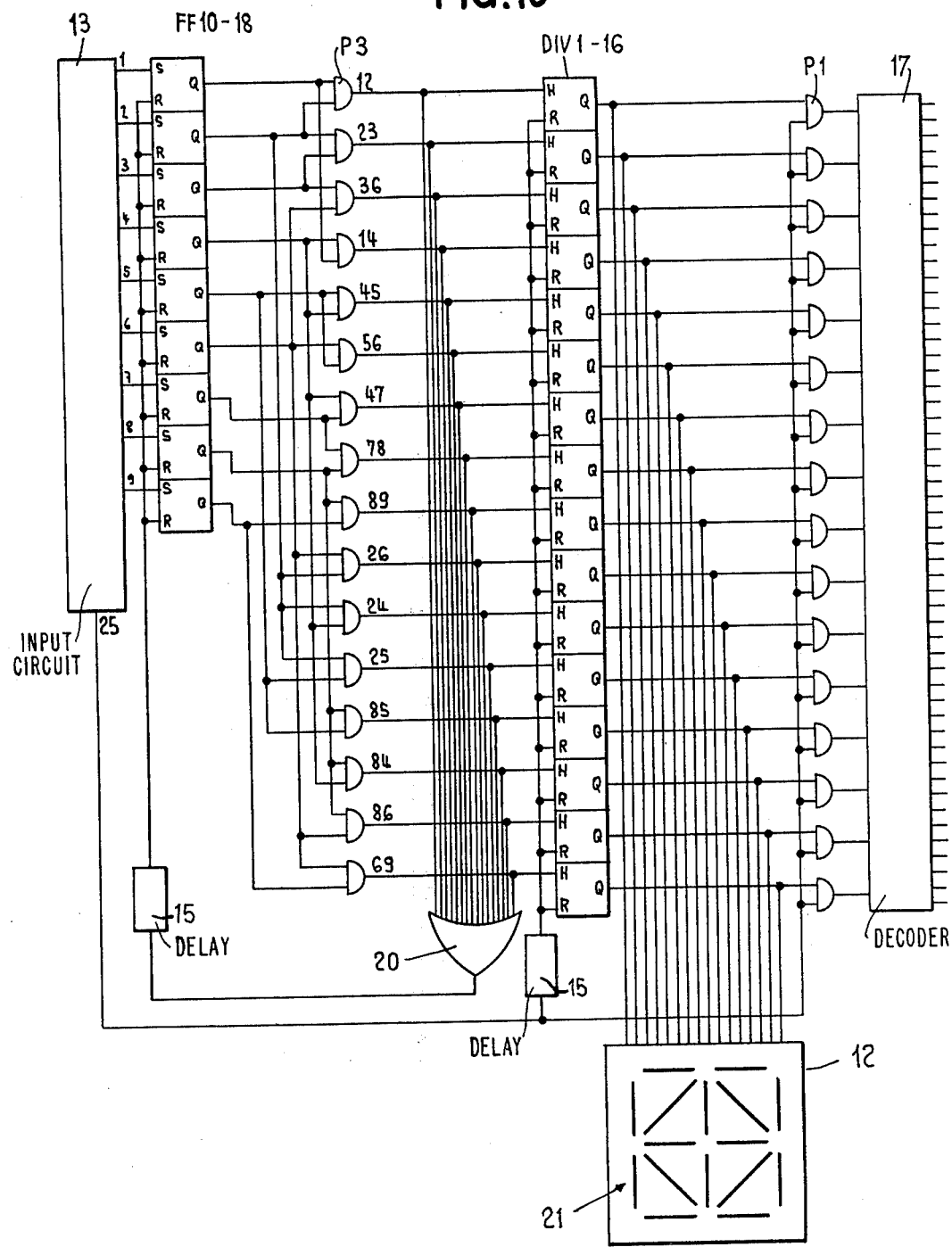

FIG. 10 shows the block diagram of the electronic circuit associated with FIG. 5. The input circuit 13 makes it possible to put at "one" two of the flip-flops FF10 to FF18 sequentially or simultaneously, and as soon as two of these flip-flops are at "one" the AND gates P3 decode the state memorised in the flip-flops FF10 to FF18, and send a pulse to the clock line of one of the divide-by-2 logic circuits DIV 1 to 16, the result of which is to put it at "one". An OR gate 20, through a delay circuit 15 then returns the flip-flops FF 10 to 18 to zero. The line 25 sends the symbol to the decoder 17 by means of the AND gate P1, and returns to zero the dividers by 2 DIV 1 to 16 by means of a delay circuit 15. If the user repeats the same action, the same two flop-flops from among the FF10 to 18 will be set at "one" and will send by way of the AND gates P3 a second pulse to the clock line of the same divider by 2 from among the DIV 1 to 16 the effect of which will be to return it to zero and to cancel the corresponding luminous element on the display 21.

Figure 7:
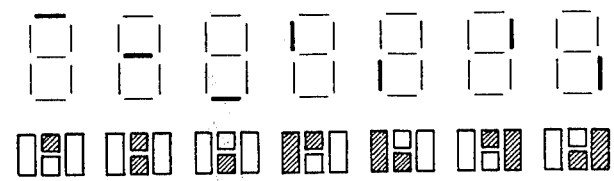
FIG. 7 is an illustration of a code associated with the device shown in FIG. 6 according to the present invention.
Figure 11:
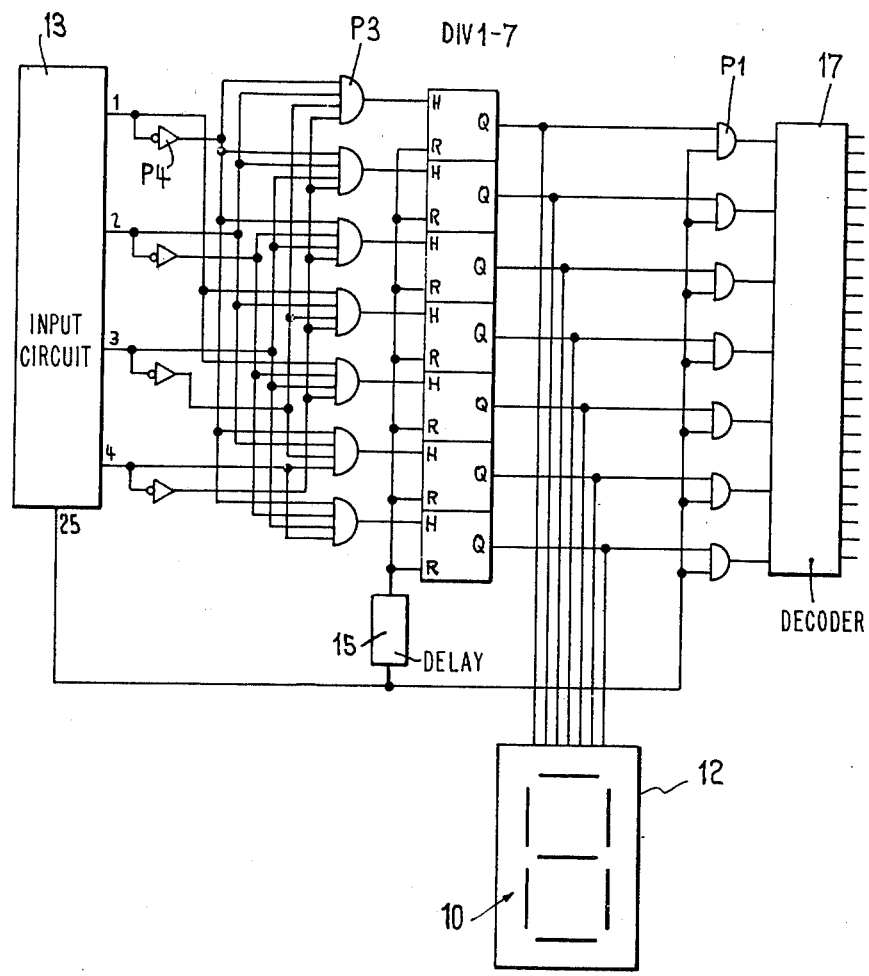

FIG. 11 shows the block diagram of the electronic circuit associated with FIGS. 6 and 7. The input circuit 13 supplies the signals relating to the keys 1 to 4 which, by means of the inverters P4 and the AND gates P3 make it possible to send a pulse to a clock line of one of the logic circuits dividing by 2 DIV 1 to 7, the result of which is to set it at "one". The line 25 sends the symbol to the decoder 17 by means of the AND gates P1 and returns to zero the dividers by 2 DIV 1 to 7 by means of a delay circuit 15.

If the user repeats the same action, a second pulse is sent over the same clock line of the same divider, the effect of which is to put at "zero" and to cancel the corresponding luminous segment on the display.

I claim:

1. A device for the input of alphanumerical characters for apparatus of small volume with a keyboard, comprising:

zones and members for the introduction of characters;

a monitoring display with a plurality of luminous segments; and electronic means coupled to said zones and members and said display, for memorising and decoding the characters;

each of said introduction zones being coupled with one segment of said monitoring display;

said electronic means enabling the characters to be formed segment by segment in response to actuation of said zones;

said zones being geometrically arranged on the keyboard so as to correspond directly to the arrangement of the segments of said display.

2. A device according to claim 1, in which said zones and the said introduction members are each formed of a sensitive element capable of being individually actuated in order to actuate corresponding display segments.

3. A device according to claim 2, in which said sensitive elements are mechanical keys.

4. A device according to claim 2, in which said sensitive elements are pick-ups.

5. A device according to claim 2, including a display having seven segments and a keyboard having seven introduction zones, each formed of a sensitive element.

6. A device according to claim 1, wherein said introduction zones include a pair of sensitive elements, capable of being individually actuated for activating said display segments, said pair of elements being geometrically arranged so as to correspond directly to the arrangement of said segment on the keyboard, each of said elements being capable of belonging to more than one of said pairs of elements.

7. A device according to claim 6, in which the number of said sensitive elements is less than the number of said display segments with said elements of said pairs being actuatable simultaneously.

8. A device according to claim 7, in which the elements of said pairs are actuatable in sequence, the order of actuation of said elements being as desired.

9. A device according to claim 1, in which some of the said introduction zones are formed of the combination of a plurality of sensitive elements, with said introduction zones being capable of being actuated according to a predetermined code for actuating the display segments.

10. A device according to claim 1, including a member for enabling the alphanumerical characters which are instructions controlling functions of the apparatus to be distinguished from the characters which are items of information to be memorised, actuation of said member being indicated by the activation of a reference mark.

11. A device according to claim 1, including a member for enabling introduction of alphanumeric characters contained in said memorising means.

12. A device according to claim 1, including a member which makes it possible to erase all or part of a character introduced into the same memorising means.

13. A device according to claim 1 in which a second action on one of said zones cancels the effect of a first action, permitting the erasing of the luminous segments of said display.

14. A device according to claim 1, including a circuit providing a signal for introducing the characters into the device after a delay measured from the last action of the user on any of the zones of said keyboard.

15. A device according to claim 1, in which actuation of one of said zones corresponding to a first luminescent display segment extinguishes said first segment.

16. A device according to claim 1, in which the small number of said elements and the arrangement thereof on the keyboard permit said zones to be actuated manually.

* * * * *